United States Patent
Liu et al.

(10) Patent No.: US 11,296,216 B2
(45) Date of Patent: Apr. 5, 2022

(54) POWER MOSFET DEVICE

(71) Applicant: SUZHOU ORIENTAL SEMICONDUCTOR CO., LTD., Jiangsu (CN)

(72) Inventors: Lei Liu, Jiangsu (CN); Yuanlin Yuan, Jiangsu (CN); Wei Liu, Jiangsu (CN); Zhendong Mao, Jiangsu (CN); Yi Gong, Jiangsu (CN)

(73) Assignee: SUZHOU ORIENTAL SEMICONDUCTUR CO., LTD., Jiangsu (CN)

( * ) Notice: Subject to any disclaimer, the term of this patent is extended or adjusted under 35 U.S.C. 154(b) by 0 days.

(21) Appl. No.: 16/644,998

(22) PCT Filed: Oct. 17, 2018

(86) PCT No.: PCT/CN2018/110570
§ 371 (c)(1),
(2) Date: Mar. 6, 2020

(87) PCT Pub. No.: WO2019/085752
PCT Pub. Date: May 9, 2019

(65) Prior Publication Data
US 2020/0203524 A1    Jun. 25, 2020

(30) Foreign Application Priority Data

Nov. 1, 2017  (CN) .......................... 201711058065.1
Nov. 1, 2017  (CN) .......................... 201711058204.0

(51) Int. Cl.
*H01L 29/78*  (2006.01)
*H01L 29/06*  (2006.01)
(Continued)

(52) U.S. Cl.
CPC ...... *H01L 29/7806* (2013.01); *H01L 29/0634* (2013.01); *H01L 29/0696* (2013.01);
(Continued)

(58) Field of Classification Search
CPC ............. H01L 29/7806; H01L 29/0634; H01L 29/0696; H01L 29/0865; H01L 29/0882;
(Continued)

(56) References Cited

U.S. PATENT DOCUMENTS

2006/0151806 A1*  7/2006  Fukuda ................. H01L 29/861
                                                                257/155
2009/0283796 A1*  11/2009  Udrea ............... H01L 29/66348
                                                                257/139
(Continued)

FOREIGN PATENT DOCUMENTS

| CN | 105702668 A | 6/2016 |
| CN | 106486481 A | 3/2017 |
| CN | 106653752 A | 5/2017 |

OTHER PUBLICATIONS

International Search Report on International Application No. PCT/CN2018/110570, dated Jan. 21, 2019 (4 pages).

*Primary Examiner* — Shahed Ahmed
(74) *Attorney, Agent, or Firm* — Buchanan Ingersoll & Rooney PC

(57) ABSTRACT

Disclosed is a power MOSFET device, the power MOSFET device includes a source, a drain, a first gate, a second gate, a body diode, and a body region contact diode. The source, the drain, and the first gate constitute a first MOSFET structure. The source, the drain, and the second gate constitute a second MOSFET structure. A cathode of the body diode is connected to the drain, and an anode of the body region contact diode is connected to an anode of the body diode, a cathode of the body region contact diode is connected to the source. The first gate is configured to control (Continued)

turning on and off of the first MOSFET structure by means of a gate voltage. The second gate is connected to the source and configured to control turning on and off of the second MOSFET structure by means of a source voltage.

11 Claims, 6 Drawing Sheets

(51) Int. Cl.
    *H01L 29/08*     (2006.01)
    *H01L 29/10*     (2006.01)
    *H01L 29/417*     (2006.01)
    *H01L 29/45*     (2006.01)

(52) U.S. Cl.
    CPC ...... *H01L 29/0865* (2013.01); *H01L 29/0882* (2013.01); *H01L 29/1033* (2013.01); *H01L 29/1095* (2013.01); *H01L 29/41741* (2013.01); *H01L 29/45* (2013.01); *H01L 29/7811* (2013.01)

(58) Field of Classification Search
    CPC ............. H01L 29/1033; H01L 29/1095; H01L 29/41741; H01L 29/45; H01L 29/7811; H01L 29/4238; H01L 29/7804; H01L 29/42376; H01L 29/7802; H01L 27/07; H01L 21/823487; H01L 27/0711–0722; H01L 29/66325–66348; H01L 29/7393–7398; H01L 29/083–0834
    See application file for complete search history.

(56) References Cited

U.S. PATENT DOCUMENTS

| | | |
|---|---|---|
| 2010/0295092 A1 | 11/2010 | Huang |
| 2012/0228634 A1* | 9/2012 | Sugi .................... H01L 29/7803 257/77 |
| 2014/0042525 A1 | 2/2014 | Darwish et al. |
| 2017/0271324 A1* | 9/2017 | Kumagai ............ H01L 29/1095 |
| 2020/0026517 A1* | 1/2020 | Harrington, III ... H01L 29/7395 |

* cited by examiner

POWER MOSFET DEVICE

The present disclosure claims the priorities of Chinese patent application No. 201711058204.0, filed on Nov. 1, 2017, and Chinese patent application No. 201711058065.1 filed on Nov. 1, 2017, disclosure of which are incorporated herein by reference in its entirety.

TECHNICAL FIELD

The present disclosure relates to the technical field of semiconductor power device, for example, a power MOSFET device.

BACKGROUND

An equivalent circuit of a power metal oxide semiconductor field effect transistor (MOSFET) device in the related art is shown in FIG. 1, the power MOSFET device includes a drain 101, a source 102, a gate 103, and a body diode 104, where the body diode 104 is an intrinsic parasitic structure in the power MOSFET device. The gate of the power MOSFET device controls turning on and off of a current channel of the power MOSFET device through a gate voltage. The working mechanism of the power MOSFET device is that: 1) when a gate source voltage Vgs is less than a threshold voltage Vth of the power MOSFET device and a drain source voltage Vds is greater than 0V, the power MOSFET device is in a turning off state; 2) when the gate source voltage Vgs is greater than the threshold voltage Vth of the power MOSFET device and the drain source voltage Vds is greater than 0V, the power MOSFET device is turned on forward, and at this time a current flows from the drain to the source via the current channel at the gate. In a case where the power MOSFET device is turned off, when the drain source voltage Vds is less than 0V, the body diode of the power MOSFET device is in a positive bias state, and a reverse current flows from the source to the drain via the body diode; at this time, there is a phenomenon of minority carriers being injected into a current of the body diode, however, the minority carriers are reverse-recovered when the power MOSFET device is turned on again, resulting in a large reverse recovery current and a long reverse recovery time of the power MOSFET device. In a power supply system including a half-bridge circuit, a full-bridge circuit, a LLC resonant circuit and the like, as well as a motor control system, a parasitic body diode in the power MOSFET device may experience a process of the minority carriers being reverse-recovered. The reverse recovery current generated by the minority carriers causes an increase in the loss of the power MOSFET device, reduces the efficiency of the system, and meanwhile also causes upper and lower transistors to directly burn out the device and thus affect the safe operation of the power MOSFET device.

In the related art, methods for improving a reverse recovery speed of the power MOSFET device include the following: (1) being in reverse parallel with a fast recovery diode, the disadvantages of this method are that a package volume is increased and the manufacturing cost is greatly increased; (2) being integrated with a Schottky matrix diode, the disadvantages of this method are that the withstand voltage is low, the leakage current is large, and the power consumption is increased; (3) adopting life control techniques such as electron irradiation, particle irradiation (proton, α particle), deep level recombination and the like, the disadvantages of this method are that the process difficulty is increased, the manufacturing cost is increased, and meanwhile the leakage current and the on-resistance of the device become large, and the power consumption is increased.

SUMMARY

The present disclosure provides a power MOSFET device having a fast reverse recovery function, to solve a problem that a power MOSFET device in the related art has a longer reverse recovery time due to a minority carrier injection problem.

Provided is a power metal oxide semiconductor field effect transistor (MOSFET) device, including a source, a drain, a first gate, a second gate, a body diode, and a body region contact diode. The source, the drain, and the first gate constitute a first MOSFET structure, and the source, the drain, and the second gate constitute a second MOSFET structure. A cathode of the body diode is connected to the drain, an anode of the body region contact diode is connected to an anode of the body diode, and a cathode of the body region contact diode is connected to the source. The first gate is configured to control turning on and off of the first MOSFET structure by means of a gate voltage. The second gate is connected to the source and configured to control turning on and off of the second MOSFET structure by means of a source voltage.

In an embodiment, a threshold voltage of the first MOSFET structure is greater than a threshold voltage of the second MOSFET structure.

In one embodiment, the MOSFET device includes an n-type drain region and an n-type drift region disposed above the n-type drain region; a conductive layer disposed above the p-type body region contact region; a first current channel disposed within the p-type body region and between the first n-type source region and the n-type drift region; and a second current channel disposed within the p-type body region and between the second n-type source region and the n-type drift region. A p-type body region is arranged within the n-type drift region, and a p-type body region contact region, a first n-type source region and a second n-type source region are arranged within the p-type body region. The conductive layer and the p-type body region contact region form the body region contact diode, the conductive layer is the cathode of the body region contact diode, and the p-type body region contact region is the anode of the body region contact diode. The first gate and a gate dielectric layer cover the first current channel. The first gate is configured to control turning on and off of the first current channel by means of the gate voltage. The second gate and the gate dielectric layer cover the second current channel. The second gate, the first n-type source region, the second n-type source region, and the conductive layer are electrically connected to each other and connected to the source voltage, and the second gate is configured to control turning on and off of the second current channel by means of the source voltage.

In one embodiment, the conductive layer is a source metal contact layer disposed above the p-type body region. A doped concentration of the p-type body region contact region is less than a maximum peak of a doped concentration of the p-type body region. The p-type body region contact region and the source metal contact layer form a Schottky barrier diode structure.

In one embodiment, the second gate is connected to the first n-type source region and the second n-type source region through the source metal contact layer, and the source metal contact layer is externally connected to the source voltage.

In one embodiment, the conductive layer is an n-type polysilicon layer disposed above the p-type body region, and the n-type polysilicon layer and the p-type body region contact region form a silicon-based body region contact diode structure.

In one embodiment, the n-type polysilicon layer is directly connected to the second gate, the first n-type source region and the second n-type source region, and the n-type polysilicon layer is externally connected to the source voltage through the source metal contact layer.

In one embodiment, the second gate is connected to the n-type polysilicon layer through the source metal contact layer, and the source metal contact layer is externally connected to the source voltage.

In one embodiment, the conductive layer is an n-type doped region disposed within the p-type body region, the n-type doped region is disposed between the first n-type source region and the second n-type source region, and the n-type doped region and the p-type body region contact region form a silicon-based body region contact diode structure.

In one embodiment, the second gate is connected to the first n-type source region, the second n-type source region and the n-type doped region through the source metal contact layer, and the source metal contact layer is externally connected to the source voltage.

In one embodiment, a turn-on voltage of the first current channel is greater than a turn-on voltage of the second current channel.

In an embodiment, a p-type columnar epitaxial doped region disposed below the p-type body region, doped impurities of the p-type columnar epitaxial doped region and doped impurities in an adjacent n-type drift region form a charge balance, thereby forming a super junction structure.

In a case where the power MOSFET device provided by the present disclosure is turned off, when the source drain voltage is greater than 0V, the body region contact diode is in a negative bias state, and thus the reverse current flowing through the body diode may be greatly reduced, whereby the minority carriers in the body diode are greatly reduced, which in turn may reduce the reverse recovery charge and the reverse recovery time of the power MOSFET device, such that the power MOSFET device is capable of having a fast reverse recovery function. And meanwhile, when the source drain voltage reaches the threshold voltage of the second MOSFET structure, the second current channel of the second MOSFET structure is turned on, such that the reverse current flows from the source to the drain via the second current channel of the second MOSFET structure.

BRIEF DESCRIPTION OF DRAWINGS

In order to explain the present embodiment, the drawings used in the description of the embodiments will be described below.

DETAILED DESCRIPTION

Figure 1:
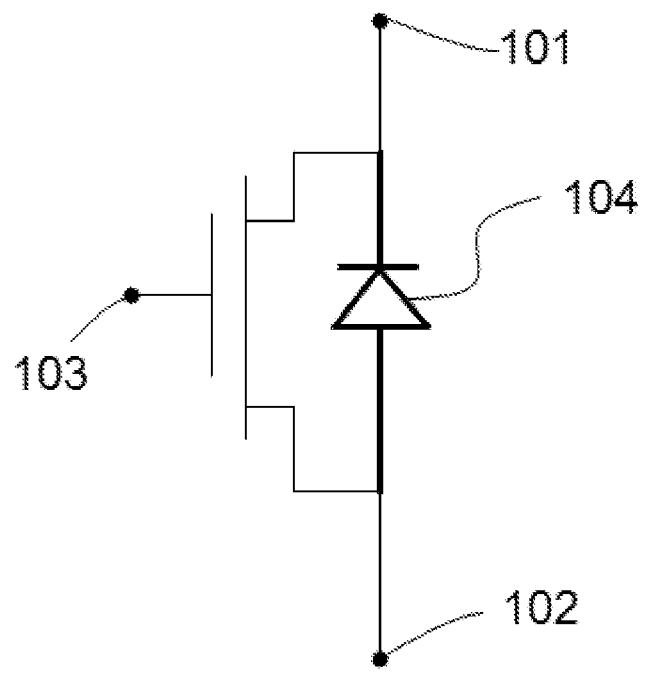
FIG. 1 is a schematic diagram of an equivalent circuit of a power MOSFET device in the related art.

The present disclosure will be described below by way of specific embodiments in conjunction with the drawings in the present embodiment.

The terms such as "having", "including" and "comprising" and the like used in the present embodiment do not exclude the presence or addition of one or more other elements or combinations thereof. Meanwhile, for the purpose of illustrating the specific embodiments of the present disclosure, the thicknesses of the layers and regions described in the present disclosure are exaggerated in the schematic diagrams listed in the drawings, and the size of the listed figures does not represent actual dimension, the drawings are schematic. The embodiments listed in the Description should not merely limited to the specific shape of the region shown in the drawings, but should include the resulting shape such as a deviation caused by the preparation and the like.

A power metal oxide semiconductor field effect transistor (MOSFET) device includes a cell region and a termination region. The cell region is used for obtaining a low on-resistance, and the termination region is used for increasing a withstand voltage of a most marginal cell in the cell region. The termination region is a general structure in the power MOSFET device, and has different design structures according to the requirements of different products. A structure of the termination region of the power MOSFET device is not shown or described in the present embodiment. The MOSFET device described in the present embodiment refers to a structure of the cell region in the power MOSFET device.

Figure 2:
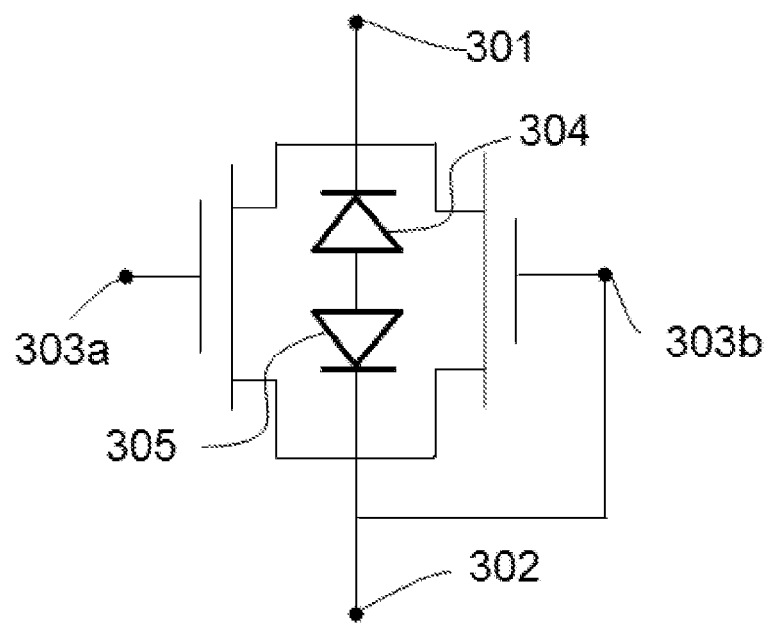
FIG. 2 is a schematic diagram of an equivalent circuit of a power MOSFET device provided in an embodiment.

FIG. 2 is a schematic diagram of an equivalent circuit of an embodiment of a power MOSFET device provided in the present embodiment. As shown in FIG. 2, the power MOSFET device provided in the present embodiment includes a drain 301, a source 302, a first gate 303*a*, a second gate 303*b*, a body diode 304, and a body region contact diode 305. The second gate 303*b* is connected to the source 302. The body region contact diode 305 may be a silicon-based diode or a Schottky barrier diode. A cathode of the body diode 304 is connected to the drain 301, an anode of the body region contact diode 305 is connected to an anode of the body diode 304, and a cathode of the body region contact diode 305 is connected to the source 302. In the power MOSFET device provided in the present embodiment, the drain 301, the source 302, and the first gate 303*a* constitute a first MOSFET structure, and the first gate 303*a* controls turning on and off of a first current channel of the first MOSFET structure by means of a gate voltage; and the drain 301, the source 302, and the second gate 303*b* of the power MOSFET device constitute a second MOSFET structure, and the second gate 303*b* is connected to the source 302, such that the second gate 303*b* controls taming on and off of a second current channel of the second MOSFET structure by means of a source voltage. In an embodiment, a threshold voltage of the first MOSFET structure is greater than a threshold voltage of the second MOSFET structure.

The working mechanism of the power MOSFET device shown in FIG. 2 is that: 1) when a gate source voltage Vgs is less than the threshold voltage Vth1 of the first MOSFET structure and a drain source voltage Vds is greater than 0V, the power MOSFET device is in a turning off state; 2) When the gate source voltage Vgs reaches the threshold voltage Vth1 of the first MOSFET structure and the drain source voltage Vds is greater than 0V, the power MOSFET device is turned on forward, at this time, the first current channel of the first MOSFET structure is turned on, and a current flows from the drain to the source via the first current channel, while the second current channel of the second MOSFET structure is in an turning off state and no current flows therethrough. In a case where the power MOSFET device is turned off, when the source voltage is greater than a drain voltage, the body region contact diode 305 is in a negative bias state, and thus a reverse current flowing through the body diode may be greatly reduced, thereby minority carriers in the body diode are greatly reduced, which in turn may greatly reduce a reverse recover charge and a reverse recovery time of the power MOSFET device, such that the power MOSFET device is capable of having a fast reverse recovery function. Meanwhile, when a source drain voltage Vsd reaches the threshold voltage Vth2 of the second MOSFET structure, the second current channel of the second MOSFET structure is in a turning on state, such that the reverse current flows from the source 302 to the drain 301 via the second current channel of the second MOSFET structure.

Figure 3:
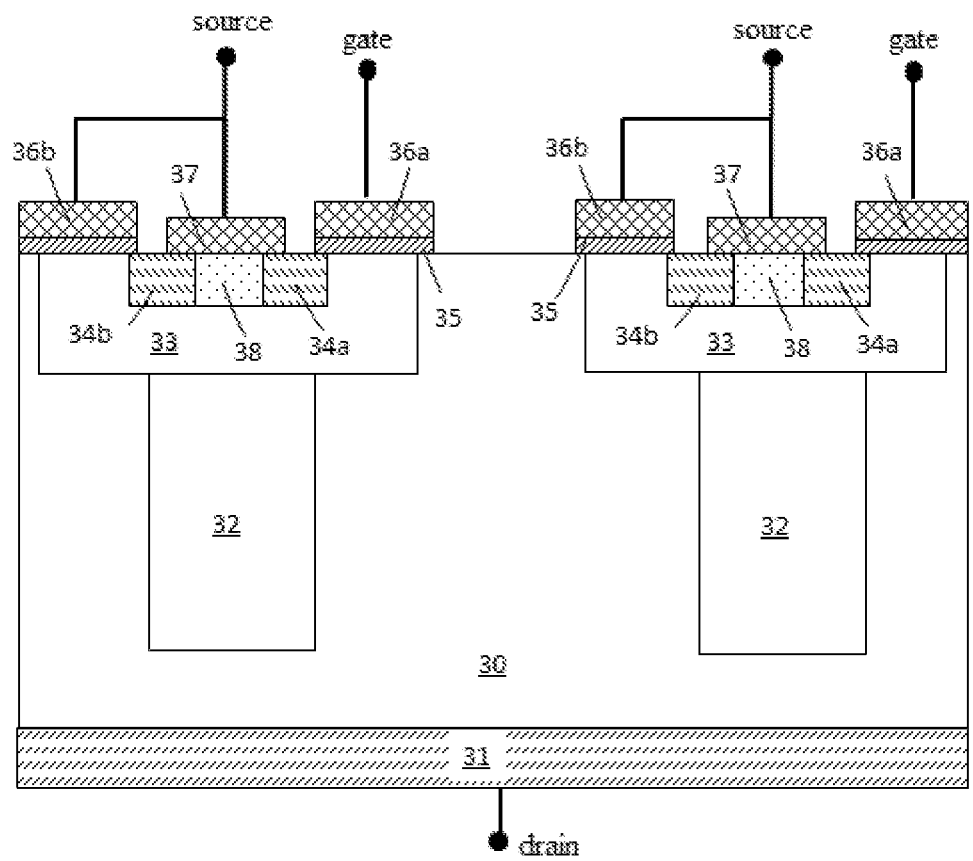
FIG. 3 is a cross-sectional structural schematic diagram of a power MOSFET device provided in an embodiment.

FIG. 3 is a cross-sectional structural schematic diagram of a power MOSFET device in the present embodiment. As shown in FIG. 3, the power MOSFET device includes an n-type drain region 31 and an n-type drift region 30 disposed above the n-type drain region 31. A p-type columnar epitaxial doped region 32 is also formed in the n-type drift region 30 (only two p-type columnar epitaxial doped regions 32 structures are exemplarily shown in FIG. 3, the number thereof is set according to actual product requirements), doped impurities of the p-type columnar epitaxial doped region 32 and doped impurities in the adjacent n-type drift region 30 form a charge balance, thereby forming a super junction structure. A p-type body region 33 is formed on top of the p-type columnar epitaxial doped region 32, i.e., the p-type columnar epitaxial doped region 32 is disposed below the p-type body region 33.

When the power MOSFET device in the present embodiment is formed, the p-type columnar doped region 32 disposed below the p-type body region 33 may not be formed either. At this time, the power MOSFET device in the present embodiment is a power MOSFET device having no the super junction structure, a power MOSFET device with a conventional structure.

In the power MOSFET device provided in the present embodiment, a p-type body region contact region 38, a first n-type source region 34a and a second n-type source region 34b are formed in the p-type body region 33, and the p-type body region contact region 38 is typically disposed between the first n-type source region 34a and the second n-type source region 34b.

A parasitic body diode structure in the power MOSFET device is formed between the p-type body region 33 and the n-type drift region 30, where the p-type body region 33 is an anode of the body diode and the n-type drift region is a cathode of the body diode.

The power MOSFET device provided in the present embodiment further includes a first current channel disposed within the p-type body region 33 and between the first n-type source region 34a and the n-type drift region 30, a first gate 36a and a gate dielectric layer 35 covering the first current channel. The first gate 36a is a control gate and controls turning on and off of the first current channel by means of a gate voltage. The power MOSFET device provided in the present embodiment further includes a second current channel disposed within the p-type body region 33 and between the second n-type source region 34b and the n-type drift region 30, a second gate 36b and the gate dielectric layer 35 covering the second current channel.

In an embodiment, a turn-on voltage of the second current channel is less than a turn-on voltage of the first current channel.

The current channel is accumulation and inversion layers that formed on a surface of a semiconductor upon being applied the gate voltage in a MOSFET structure. In the drawings of the present embodiment, the first current channel and the second current channel in the power MOSFET device are both not shown.

The power MOSFET device provided in the present embodiment further includes a conductive layer 37 disposed above the p-type body region contact region 38. The conductive layer 37 and the p-type body region contact region 38 form a body region contact diode structure, where the conductive layer 37 is a cathode of the body region contact diode, and the p-type body region contact region 38 is an anode of the body region contact diode, such that the anode of the body region contact diode is connected to the anode of the body diode. In an embodiment, the conductive layer 37 may be an n-type polysilicon layer or a metal layer, and thus the body region contact diode may be a silicon-based body region contact diode or a Schottky barrier diode.

The second gate 36b, the first n-type source region 34a, the second n-type source region 34b and the conductive layer 37 are electrically connected and connected to a source voltage, such that the second gate 36b controls turning on and off of the second current channel by means of the source voltage.

In the power MOSFET device shown in FIG. 3, the conductive layer 37 is in direct contact connection with the first n-type source region 34a and the second n-type source region 34b, therefore, it is only necessary to electrically connect the conductive layer 37 and the second gate 36b.

Figure 4:
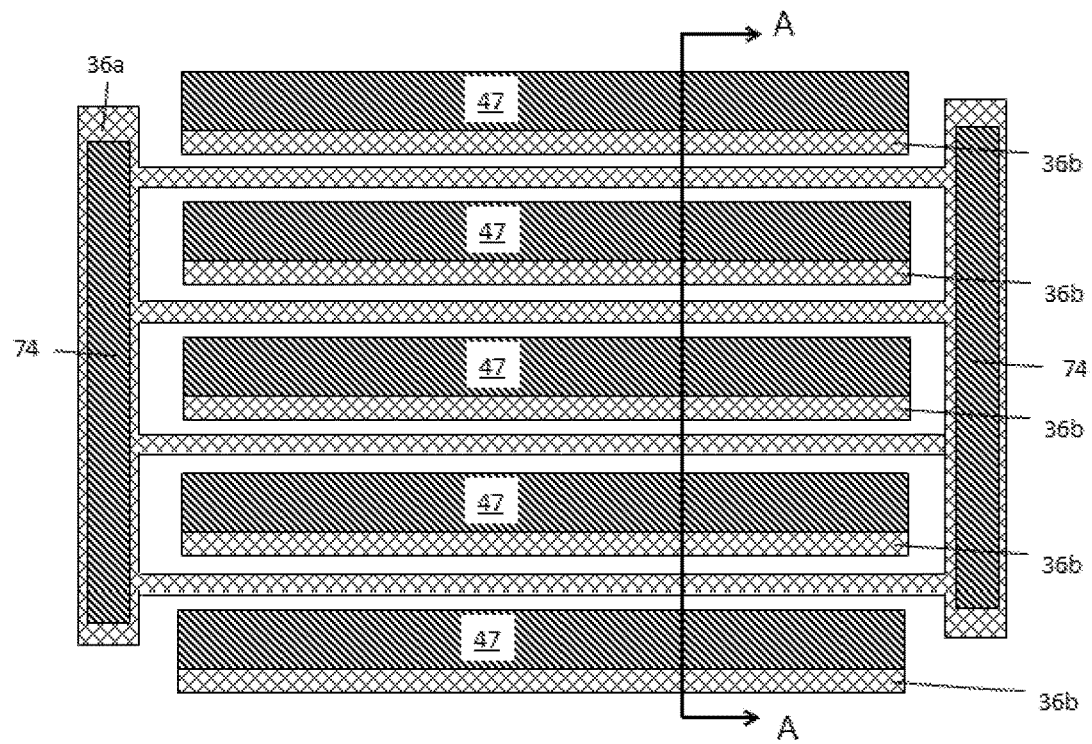
FIG. 4 is a top structural schematic diagram of a power MOSFET device provided in an embodiment.
Figure 5:
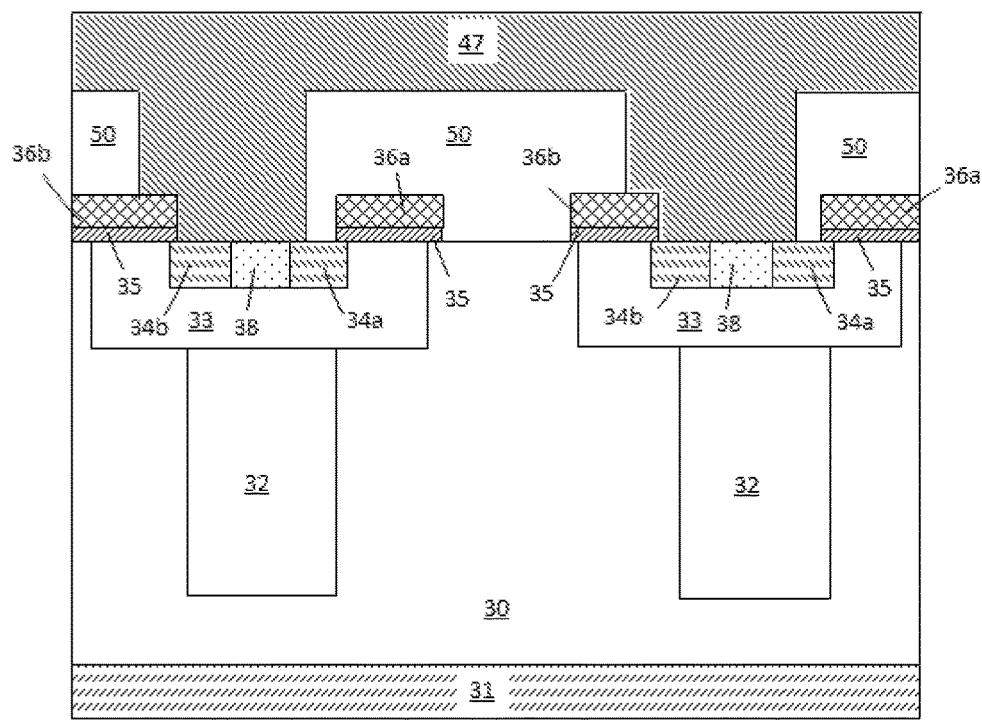
FIG. 5 is a cross-sectional structural schematic diagram of the power MOSFET device shown in FIG. 4 along an AA direction.

FIG. 4 is a top structural schematic diagram of a power MOSFET device provided in the present embodiment, where FIG. 4 is not a top view, instead, FIG. 4 only shows the positional relationship of partial structure of the power MOSFET device in the present embodiment from a top perspective. FIG. 5 is a cross-sectional structural schematic diagram of the power MOSFET device shown in FIG. 4 along an AA direction, and only two columnar epitaxial doped regions 32 structures are exemplarily shown in FIG. 5. FIG. 4 and FIG. 5 correspond to an embodiment of the power MOSFET device provided in the present disclosure in which the body region contact diode adopts a Schottky barrier diode on the basis of the power MOSFET device shown in FIG. 3. As shown in FIG. 4 and FIG. 5, a source metal contact layer 47 is formed above the p-type body region 33. The source metal contact layer 47 is a conductive layer disposed above the p-type body region contact region 38. At this time, A doped concentration of the p-type body region contact region 38 needs to be less than a maximum peak of a doped concentration of the p-type body region 33, whereby the p-type body region contact region 38 and the source metal contact layer 47 form a Schottky barrier diode structure, where the source metal contact layer 47 is a cathode of the body region contact diode, and the p-type body region contact region 38 is an anode of the body region contact diode. A position of the source metal contact layer in a source metal contact hole is only exemplarily shown in FIG. 4. The source metal contact layer 47 is directly connected to the second gate 36b, the first n-type source region 34a, and the second n-type source region 34b, and the source metal contact layer 47 is externally connected to a source voltage, whereby the second gate 36b controls turning on and off of the second current channel facing toward a side of the second n-type source region 34b by means of the source voltage. The first gate 36a is externally connected to a gate voltage through a gate metal contact layer 74, whereby the first gate 36a controls turning on and off of the first current channel facing toward a side of the first n-type source region 34a by means of the gate voltage. The source metal contact layer 47 and the gate metal contact layer 74 are separated by an interlayer insulating layer 50. The interlayer insulating layer 50 is usually a material such as a silicon glass, a borophosphosilicate glass or a phosphosilicate glass.

Figure 6:
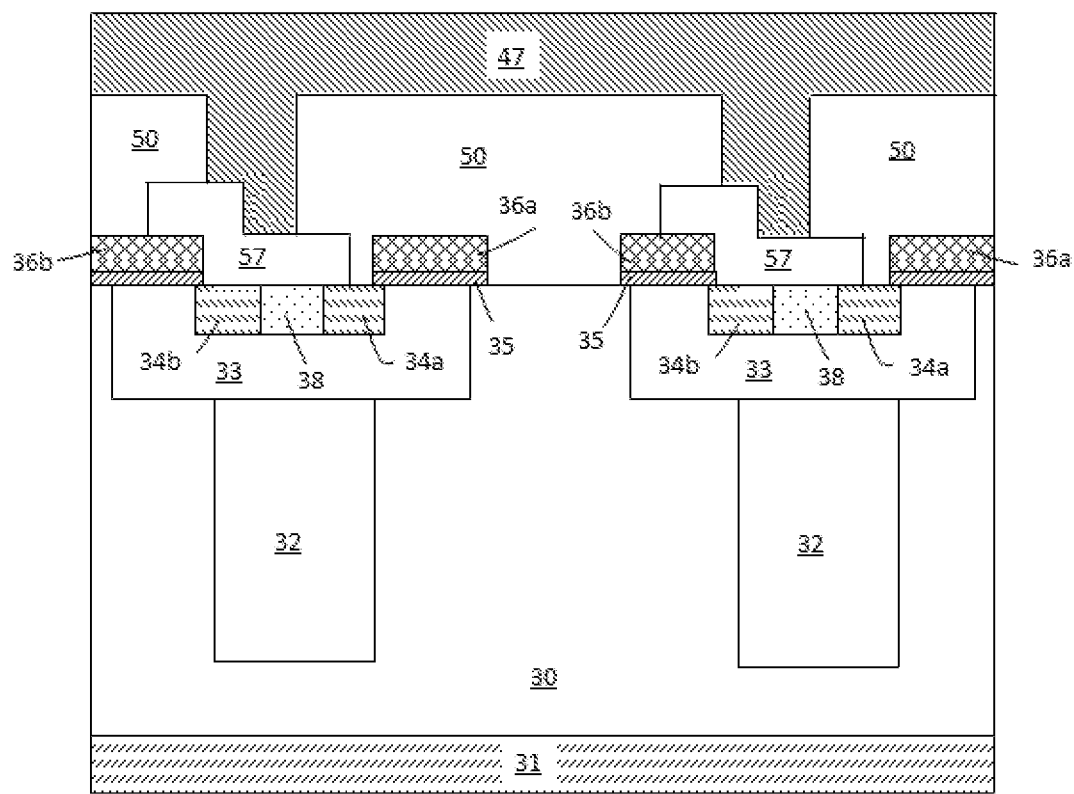
FIG. 6 is a cross-sectional structural schematic diagram of a power MOSFET device provided in an embodiment.

FIG. 6 is a cross-sectional structural schematic diagram of a power MOSFET device provided in the present embodiment. FIG. 6 corresponds to an embodiment of the power MOSFET device provided in the present disclosure in which the body region contact diode adopts a silicon-based diode on the basis of the power MOSFET device shown in FIG. 3. As shown in FIG. 6, an n-type polysilicon layer 57 is formed above the p-type body region 33, and the n-type polysilicon layer 57 is a conductive layer disposed above the p-type body region contact region 38, whereby the p-type body region contact region 38 and the n-type polysilicon layer 57 form a silicon-based body region contact diode structure, where the n-type polysilicon layer 57 is a cathode of the body region contact diode, and the p-type body contact region 38 is an anode of the body region contact diode. The n-type polysilicon layer 57 may be in direct contact connection with the second gate 36b, the first n-type source region 34a, and the second n-type source region 34b, and then the n-type polysilicon layer 57 is externally connected to a source voltage through the source metal contact layer 47, as shown in FIG. 6. The n-type polysilicon layer 57 may also be in direct contact connection with the first n-type source region 34a and the second n-type source region 34b, and the second gate 36b and the n-type polysilicon layer 57 are connected by the source metal contact layer, and then the source metal contact layer is externally connected to the source voltage. In the present embodiment, the n-type polysilicon layer 57 is in direct contact connection with the second gate 36b, the first n-type source region 34a and the second n-type source region 34b, and then the n-type polysilicon layer 57 is externally connected to the source voltage through the source metal contact layer 47, whereby the second gate 36b controls turning on and off of the second current channel facing towards a side of the second n-type source region 34b by means of the source voltage. The first gate 36a is externally connected to a gate voltage through a gate metal contact layer (based on the positional relationship of the cross section, the gate metal contact layer is not shown in FIG. 6), whereby the first gate 36a controls turning on and off of the first current channel facing toward a side of the first n-type source region 34a by means of the gate voltage. The source metal contact layer 47 and the gate metal contact layer are separated by the interlayer insulating layer 50. The interlayer insulating layer 50 is usually a material such as a silicon glass, a borophosphosilicate glass or a phosphosilicate glass.

Figure 7:
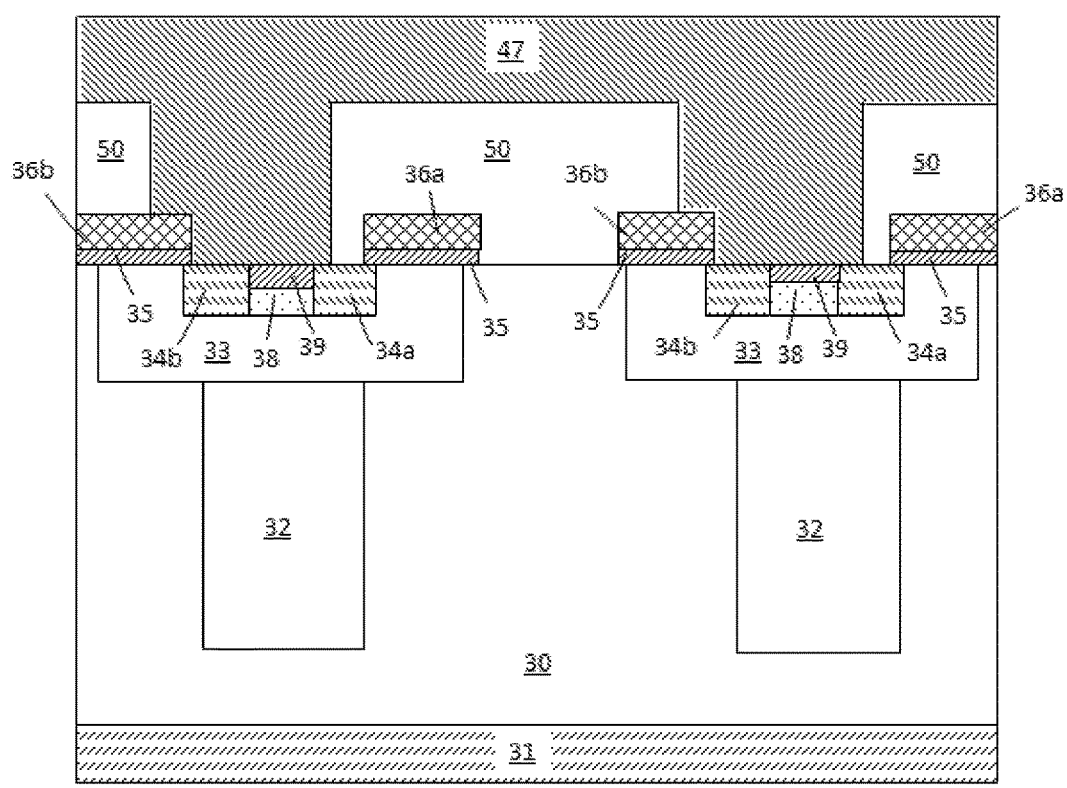
FIG. 7 is a cross-sectional structural schematic diagram of a power MOSFET device provided in an embodiment.

FIG. 7 is a cross-sectional structural schematic diagram of a power MOSFET device provided in the present embodiment. As shown in FIG. 7, the power MOSFET device in the present embodiment includes an n-type drain region 31 and an n-type drift region 30 disposed above the n-type drain region 31, and a p-type columnar epitaxial doped region 32 is also formed in the n-type drift region 30 (structures of only two columnar epitaxial doped regions 32 are exemplarily shown in FIG. 7, the number thereof is set according to actual product requirements). Doped impurities of the p-type columnar epitaxial doped region 32 and doped impurities in the adjacent n-type drift region 30 form a charge balance, thereby forming a super junction structure.

A parasitic body diode structure in the power MOSFET device is formed between the p-type body region 33 and the n-type drift region 30, where the p-type body region 33 is an anode of the body diode, and the n-type drift region is a cathode of the body diode.

The power MOSFET device provided in the present embodiment further includes a p-type body region contact region 38, an n-type doped region 39, a first n-type source region 34a and a second n-type source region 34b, which are disposed in the p-type body region 33. The p-type body region contact region 38 and the n-type doped region 39 are both disposed between the first n-type source region 34a and the second n-type source region 34b, and the n-type doped region 39 is disposed above the p-type body region contact region 38. The n-type doped region 39 is a conductive layer disposed above the p-type body region contact region 38, whereby the n-type doped region 39 and the p-type body region contact region 39 form a silicon-based body region contact diode structure, where the n-type doped region 39 is a cathode of the body region contact diode, and the p-type body region contact region 38 is an anode of the body region contact diode, such that the anode of the body region contact diode is connected to the anode of the body diode.

The power MOSFET device provided in the present embodiment further includes a first current channel disposed within the p-type body region 33 and between the first n-type source region 34a and the n-type drift region 30, a first gate 36a and a gate dielectric layer 35 covering the first current channel. The first gate 36a is a control gate and controls turning on and off of the first current channel by means of a gate voltage.

The power MOSFET device provided in the present embodiment further includes a second current channel disposed within the p-type body region 33 and between the second n-type source region 34b and the n-type drift region 30, a second gate 36b and the gate dielectric layer 35 and a second gate 36b covering the second current channel.

In an embodiment, a turn-on voltage of the second current channel is less than a turn-on voltage of the first current channel.

The second gate 36b, the first n-type source region 34a, the second n-type source region 34b and the n-type doped region 39 are electrically connected and connected to a source voltage. In the power MOSFET device shown in FIG. 7, the n-type doped region 39 is connected to the first n-type source region 34a, the second n-type source region 34b and the second gate 36b through a source metal contact layer 47. The source metal contact layer 47 is externally connected to the source voltage, whereby the second gate 36b controls turning on and off of the second current channel by means of the source voltage. The first gate electrode 36a is externally connected to the gate voltage through a gate metal contact layer (based on the positional relationship of the cross section, the gate metal contact layer is not shown in FIG. 7), whereby the first gate electrode 36a controls turning on and off of the first current channel by means of the gate voltage. The source metal contact layer 47 and the gate metal contact layer are separated by an interlayer insulating layer 50. The interlayer insulating layer 50 is usually a material such as a silicon glass, a borophosphosilicate glass or a phosphosilicate glass.

Figure 8:
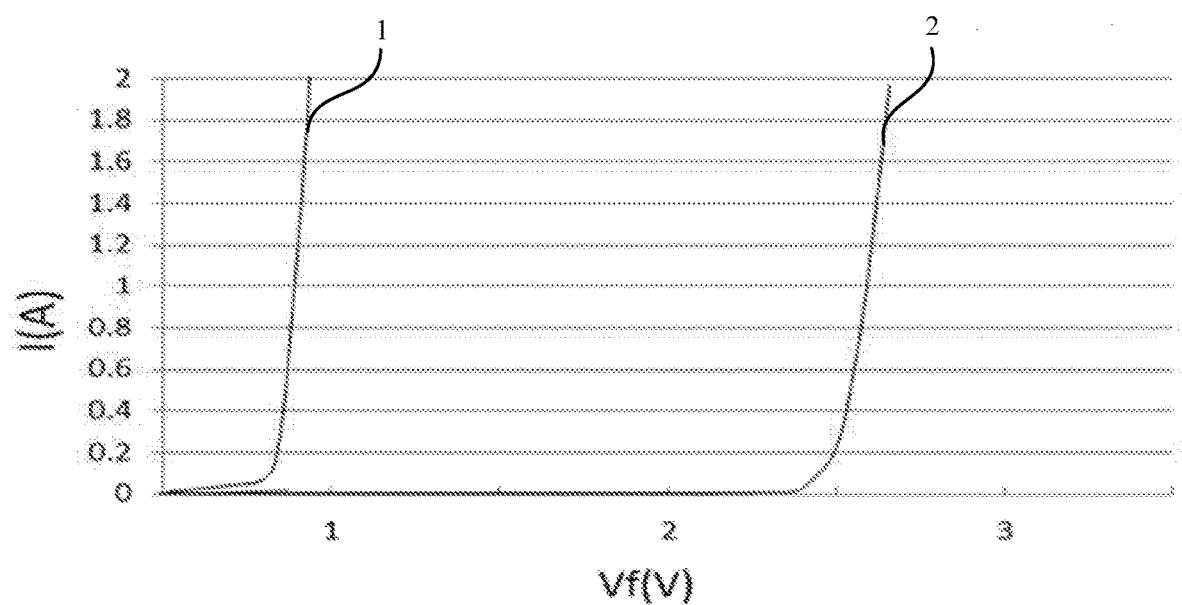
FIG. 8 is a test comparison diagram of a Vf curve of a power MOSFET device provided in an embodiment with a Vf curve of a power MOSFET device in the related art.

FIG. 8 is a test comparison diagram of a Vf curve of a power MOSFET device in the present embodiment with a Vf curve of a power MOSFET device having no a body region contact diode in the related art. As shown in FIG. 8, a curve 1 represents a test diagram of a Vf curve of a forward voltage of the power MOSFET device having no the body region contact diode in the related art, and a curve 2 represents a test diagram of the Vf curve of the power MOSFET device having the body region contact diode in the present embodiment, where Vf represents a voltage applied to a body diode (i.e., a source drain voltage Vsd of the power MOSFET device), and I(A) represents a reverse current flowing through the body diode. As can be seen from FIG. 8, in a case where the power MOSFET device having no the body region contact diode in the related art is turned off, after the source drain voltage is applied, and the reverse current I(A) flowing through the body diode is rapidly increased; while in the power MOSFET device in the present embodiment, substantially no reverse current flows through the body diode because the body region contact diode is in a negative bias state, and the reverse current flowing through the body diode is rapidly increased only when the body region contact diode is reversely breakdown. Due to the fact that the source drain voltage of the power MOSFET device in the present embodiment upon being turned off will not cause reverse breakdown of the body region contact diode, substantially no reverse current flows through the body diode when the power MOSFET device in the present embodiment is turned off, whereby minority carriers in the body diode of the power MOSFET device may be greatly reduced, which may greatly reduce a reverse recovery charge and a reverse recovery time of the power MOSFET device, such that the power MOSFET device is capable of having a fast reverse recovery.

Figure 9:
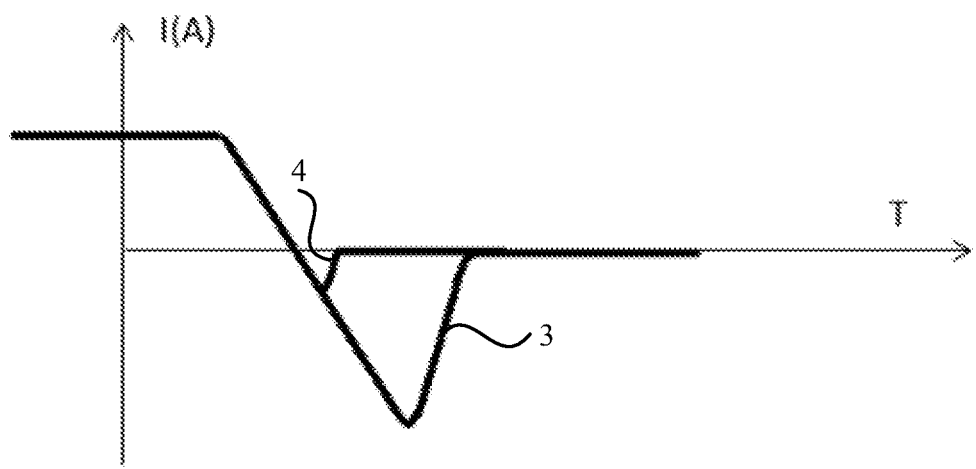
FIG. 9 is a test comparison diagram of a reverse recovery curve of a power MOSFET device provided in an embodiment and a reverse recovery curve of a power MOSFET device in the related art.

FIG. 9 is a test comparison diagram of a reverse recovery curve of a power MOSFET device provided in the present embodiment and a reverse recovery curve of a power MOSFET device having no a body region contact diode in the related art. As shown in FIG. 9, a curve 3 represents the reverse recovery curve of the power MOSFET device having no the body region contact diode in the related art, and a curve 4 represents the reverse recovery curve of the power MOSFET device having the body region contact diode in the present embodiment. As can be seen from FIG. 9, the power MOSFET device having the body region contact diode in the present embodiment has a faster reverse recovery speed than that of the power MOSFET device having no the body region contact diode in the related art.

What is claimed is:

1. A power metal oxide semiconductor field effect transistor (MOSFET) device, comprising a source, a drain, a first gate, a second gate, a body diode, and a body region contact diode, wherein the source, the drain, and the first gate constitute a first MOSFET structure; the source, the drain, and the second gate constitute a second MOSFET structure; a cathode of the body diode is connected to the drain, and an anode of the body region contact diode is connected to an anode of the body diode, a cathode of the body region contact diode is connected to the source, the first gate is configured to control turning on and off of the first MOSFET structure by means of a gate voltage, the second gate is connected to the source and configured to control turning on and off of the second MOSFET structure by means of a source voltage.

2. The power MOSFET device of claim 1, wherein a threshold voltage of the first MOSFET structure is greater than a threshold voltage of the second MOSFET structure.

3. The power MOSFET device of claim 1, further comprising:
an n-type drain region and an n-type drift region disposed above the n-type drain region, wherein a p-type body region is arranged within the n-type drift region, and a p-type body region contact region, a first n-type source region and a second n-type source region are arranged within the p-type body region;
a conductive layer disposed above the p-type body region contact region, wherein the conductive layer and the p-type body region contact region form the body region contact diode, the conductive layer is the cathode of the body region contact diode, and the p-type body region contact region is the anode of the body region contact diode;
a first current channel disposed within the p-type body region and between the first n-type source region and the n-type drift region, wherein the first gate and a gate dielectric layer cover the first current channel, and wherein the first gate is configured to control turning on and off of the first current channel by means of the gate voltage; and
a second current channel disposed within the p-type body region and between the second n-type source region and the n-type drift region, wherein the second gate and the gate dielectric layer cover the second current channel, and wherein the second gate, the first n-type source region, the second n-type source region, and the conductive layer are electrically connected to each other and connected to the source voltage, the second gate is configured to control turning on and off of the second current channel by means of the source voltage.

4. The power MOSFET device of claim 3, wherein the conductive layer is a source metal contact layer disposed above the p-type body region, a doped concentration of the p-type body region contact region is less than a maximum peak of a doped concentration of the p-type body region, the p-type body region contact region and the source metal contact layer form a Schottky barrier diode structure.

5. The power MOSFET device of claim 4, wherein the second gate is connected to the first n-type source region and the second n-type source region through the source metal contact layer, and the source metal contact layer is externally connected to the source voltage.

6. The power MOSFET device of claim 3, wherein the conductive layer is an n-type polysilicon layer disposed above the p-type body region, and the n-type polysilicon layer and the p-type body region contact region form a silicon-based body region contact diode structure.

7. The power MOSFET device of claim 6, wherein the n-type polysilicon layer is directly connected to the second gate, the first n-type source region and the second n-type source region, and the n-type polysilicon layer is externally connected to the source voltage through the source metal contact layer.

8. The power MOSFET device of claim 3, wherein the conductive layer is an n-type doped region disposed within the p-type body region, and the n-type doped region and the p-type body region contact region form a silicon-based body region contact diode structure.

9. The power MOSFET device of claim 8, wherein the second gate is connected to the first n-type source region, the second n-type source region and the n-type doped region through the source metal contact layer, and the source metal contact layer is externally connected to the source voltage.

10. The power MOSFET device of claim 3, wherein a turn-on voltage of the first current channel is greater than a turn-on voltage of the second current channel.

11. The power MOSFET device of claim 3, further comprising a p-type columnar epitaxial doped region disposed below the p-type body region, wherein doped impurities of the p-type columnar epitaxial doped region and doped impurities in an adjacent n-type drift region form a charge balance, thereby forming a super junction structure.

* * * * *